(12) United States Patent
Nevo (10) Patent No.: US 6,522,033 B1
(45) Date of Patent: Feb. 18, 2003

(54) HIGH SENSITIVITY ELECTRICAL SWITCHING CIRCUIT

(76) Inventor: Hayim Nevo, Haroshet Street 3/7, 27000 Kiryat Bailik (IL)

(*) Notice: Subject to any disclaimer, the term of this patent is extended or adjusted under 35 U.S.C. 154(b) by 0 days.

(21) Appl. No.: 09/509,460

(22) PCT Filed: Sep. 25, 1998

(86) PCT No.: PCT/IL98/00464

§ 371 (c)(1),
(2), (4) Date: Jul. 19, 2000

(87) PCT Pub. No.: WO99/17448

PCT Pub. Date: Apr. 8, 1999

(30) Foreign Application Priority Data

Sep. 29, 1997 (IL) .................................... 121859

(51) Int. Cl.[7] .............................................. H01H 47/00
(52) U.S. Cl. .......................... 307/125; 307/326; 361/42
(58) Field of Search ................................ 307/125, 326; 361/42, 45, 49, 50

(56) References Cited

U.S. PATENT DOCUMENTS

| | | | | |
|---|---|---|---|---|
| 4,029,996 A | * | 6/1977 | Miffitt | 307/326 |
| 4,031,431 A | | 6/1977 | Gross | |
| 4,375,660 A | * | 3/1983 | Tate et al. | 361/42 |
| 5,267,116 A | * | 11/1993 | Avitan | 361/45 |
| 5,426,552 A | * | 6/1995 | Avitan | 361/42 |
| 5,485,340 A | * | 1/1996 | Avitan | 361/45 |
| 5,606,480 A | | 2/1997 | Nevo | |
| 5,841,617 A | * | 11/1998 | Watkins, Jr. et al. | 361/106 |
| 6,023,400 A | * | 2/2000 | Nevo | 361/42 |

FOREIGN PATENT DOCUMENTS

| | | |
|---|---|---|
| DE | 26 18 371 | 11/1977 |
| EP | 0 695 015 | 1/1996 |
| FR | 2 468 130 | 4/1981 |
| WO | 97 36358 | 10/1997 |

OTHER PUBLICATIONS

Bernstein, "Electrical Shock Hazards and Safety Standards", *IEEE Transactions and Education*, vol. 34, No. 3, pp. 216–222, (1991).

* cited by examiner

*Primary Examiner*—Brian Sircus
*Assistant Examiner*—Sharon Polk
(74) *Attorney, Agent, or Firm*—Browdy and Neimark, P.L.L.C.

(57) ABSTRACT

A switching circuit for use with an electrical appliance, and comprising first and second normally open switch terminals and a high sensitivity impedance measuring circuit coupled to the first and second switch terminals for measuring an impedance therebetween, and producing at an output thereof a switching signal if the impendance is lower than a predetermined threshold of 500 MΩ. The appliance is coupled to the output of the impedance measuring circuit so as to be responsive to the switching signal. The circuit finds particular application for controlling and protecting electrical appliances operating from an a.c. electrical means supply, in which case one of the switch terminals is connected to a virtual ground connection which is electrically floating with respect to a ground feeder of an electrical mains supply. In the event of electrical contact between the virtual ground connection and the other switch contact, an apparent ground fault is produced, which gives raise to a small current which is detected by the impendance measuring circuit so as to produce a switching signal which may then be used to operate a suitable relay for controlling the appliance.

39 Claims, 4 Drawing Sheets

FIG. 5

HIGH SENSITIVITY ELECTRICAL SWITCHING CIRCUIT

CROSS REFERENCE TO RELATED APPLICATION

The present application is the national stage under 35 U.S.C. 371 of PCT/IL98/00464, filed Sep. 25, 1998.

FIELD OF THE INVENTION

This invention is related to electrical switching and control circuits.

BACKGROUND OF THE INVENTION

Electrical and electronic devices are frequently required to be operated and controlled remotely via suitable switching and control circuits. In the case of high power devices operating on relatively high voltages, such as devices intended for operation on the main electrical distribution network, the resulting control and switching currents can be significant reaching several hundred milliamperes. When currents of such magnitudes flow through long cables, there is generated a significant voltage across the cable whose magnitude is proportional to the specific impedance, or resistivity, of the cable. This, in turn, gives rise to energy wastage and increased operating costs. The voltage across the cable can be reduced by employing lower gauge (i.e. thicker) cables whose resistivity is correspondingly lower, but this results in the control and switching cables being bulky as well as expensive.

Published PCT application no. WO 95/31028, in the name of present inventor, discloses a detector for monitoring the integrity of a ground connection to an electrical appliance having live and neutral terminals for feeding current to the appliance from respective live and neutral feeders of an electrical supply having a ground point for connecting to the ground terminal of the appliance. The detector comprises a differential comparator circuit for comparing a voltage at the neutral connection with a voltage at the ground terminal of the appliance and producing a fault signal if a difference therebetween exceeds a predetermined threshold. A switching device is connected in at least one of the live and neutral connections so as to be opened by a relay operatively coupled to the detector and responsive to the fault signal produced thereby.

WO 97/36358 published on Oct. 2, 1997, in the name of the present applicant, discloses a specific application of such a detector for use with electrical appliances which are either ungrounded or whose ground connection is impaired. Thus, in accordance with WO 97/36358 there is provided a protection device for use in conjunction with an electrical appliance having an electrically conductive outer casing and which protects against the casing becoming "live" regardless of the state of a ground connection associated with an electrical supply to which the appliance is connected, the electrical appliance having live and neutral terminals for feeding current to the appliance from respective live and neutral feeders of the electrical supply, said device comprising:

a virtual ground connection which is electrically floating with respect to said ground connection of the electrical supply, said virtual ground connection for electrically coupling to the casing of the electrical appliance instead of the ground connection of the electrical supply, and a ground impedance measuring circuit for measuring an impedance between either the live or neutral terminals and the virtual ground connection of the appliance and producing a fault signal if said impedance falls below a predetermined threshold.

In effect, the protection circuit disclosed in WO 97/36358 employs the differential comparator subject of WO 95/31028 to compare the voltages between live and neutral and a floating ground connection such that any discrepancy between the measured voltages is indicative of a ground fault. There are several major advantages of the use of a floating ground connection as opposed to a regular ground connection. First, there is no danger of a person effecting electrical contact with the floating ground connection becoming electrocuted since there is no return path through actual ground for the fault current. Second, by using appropriate resistors in the differential comparator circuit, the "fault" current required to register an imbalance may be reduced to fractions of a nanoampere (i.e. less than $10^{-9}$ ampere) as distinct from the milliamperes associated with conventional ground fault detector circuits. Yet another advantages is, of course, the lack of dependence on a reliable ground connection.

The use of a floating ground connection per se is known. Thus, EP 695 105 discloses a protection device for use with an appliance having a ground connection 33, which might be the metal casing of the electrical appliance, which is connected via a resistor R1 to a protection circuit comprising elements EC2, EC3, EC4 and OC1 so that if the leakage current flowing through R1 exceeds a certain threshold, this protection circuit provides a trigger to a relay coil RL1 so as to open the primary switch contacts SW1 and SW2. Thus, the protection circuit produces a fault signal if the ground impedance falls below a predetermined threshold.

Likewise, FR 2468430 discloses a protection device wherein, as in above-described EP 695 105, the principle of operation is that, in the event of a ground fault, there will be a leakage current flowing through the ground connection and the magnitude of this leakage current is employed in order to provide a trip signal for the main current breaker(s). In the case of a regular ground fault between either the live or neutral feeders and GND, the resulting ground leakage current which flows through the virtual ground connection effects adequate protection.

However, in the event of a short-circuit between the live and neutral connections, there will under normal circumstances be no ground leakage current and therefore the circuits described in EP 695 105 and FR 2468430 will afford no protection. This is a very serious drawback because short-circuit faults represent a significant risk of fire.

SUMMARY OF THE INVENTION

It is an object of the invention to provide a high sensitivity switching circuit for allowing remote switching of an electrical device via a pair of wires carrying negligible current whereby high gauge cables of minimal cross-sectional area may be employed without resulting in unacceptable ohmic losses.

In accordance with a broad aspect of the invention there is provided a switching circuit for use with an electrical appliance, the switching circuit comprising:

first and second normally open switch terminals, a high sensitivity impedance measuring circuit coupled to the first and second switch terminals for measuring an impedance therebetween, said high sensitivity impedance measuring circuit producing at an output thereof a switching signal if said impedance is lower than a predetermined threshold of 500MΩ;

the appliance being coupled to said output so as to be responsive to said switching signal.

The invention finds particular application for controlling and protecting electrical appliances operating from an a.c. electrical mains supply. For such applications, one of the switch terminals is connected to a virtual ground connection which is electrically floating with respect to a ground feeder of an electrical mains supply. In the event of electrical contact between the virtual ground connection and the other switch contact, an apparent ground fault is produced. The ground fault gives rise to a small current which is detected by the impedance measuring circuit so as to produce a switching signal which may then be used to operate a suitable relay for controlling the appliance.

A sufficiently strong fault signal may be generated upon contact between the virtual ground connection and ground by a human being having a body resistance typically in the order of several thousand ohms. By such means, human contact with one or both of the switch terminals is sufficient to register a "ground fault" thus producing the required switching signal. If desired, one or both of the switch terminals may be connected to a metal touch plate such that momentary contact therewith by a human being results in the generation of the required switching signal.

Alternatively, both switch terminals can be mutually floating with respect to ground whilst exhibiting a very high contact impedance of several hundred MΩ. Shorting the switch contacts, even by means of finger contact, reduces the impedance to below the threshold of the impedance measuring circuit, thereby produce the switching signal. In this context, it is to be understood that "shorting" means lowering the contact resistance between the two switch contacts to less than the predetermined threshold of 500MΩ. The resulting current which then flows into the impedance measuring circuit may be as low as several nanoamperes.

According to a preferred embodiment of the invention, the impedance measuring circuit comprises a differential comparator circuit for comparing a fraction of the voltage between the live and neutral connections of the electrical supply with a voltage at the virtual ground connection. A fault signal is produced if a difference between the two voltages exceeds a predetermined threshold.

BRIEF DESCRIPTION OF THE DRAWINGS

In order to understand the invention and to see how it may be carried out in practice, there will now be described a switching circuit for connection to an electrical supply feeder, by way of non-limiting example only and with reference to the accompanying drawings, in which.

DETAILED DESCRIPTION OF PREFERRED EMBODIMENTS

Figure 1:
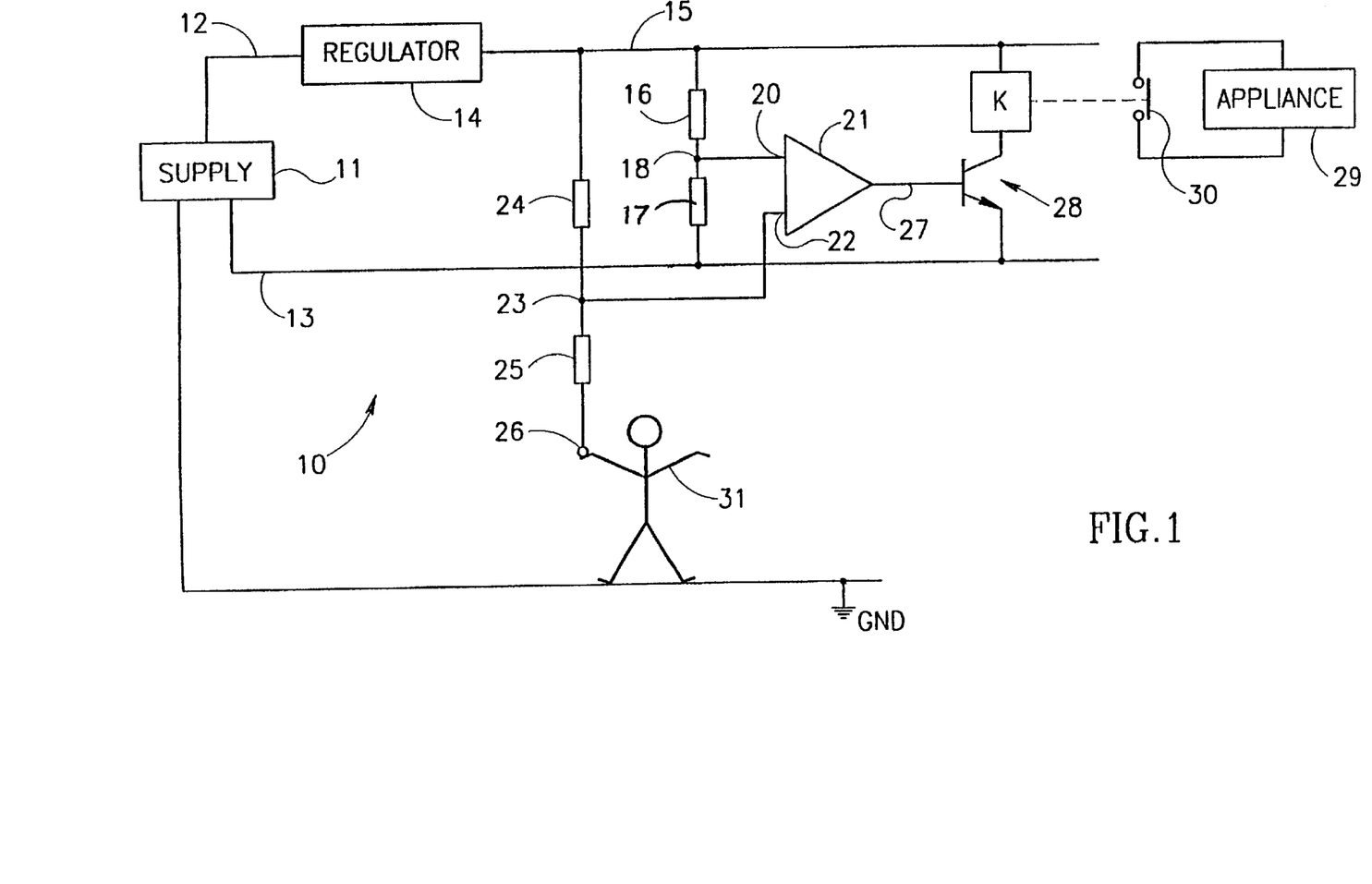
FIG. 1 shows schematically the principles of the invention.

FIG. 1 shows a system 10 comprising an electrical supply 11 having live and neutral supply rails phases 12 and 13, respectively and a ground rail, GND. Connected to the live rail 12 is a voltage regulator 14 for producing at an output 15 thereof a regulated low voltage d.c. supply. The output 15 of the regulator 14 thus constitutes a high d.c. rail, whilst the neutral supply rail 13 constitutes a low d.c. rail and will be referred to thereby in the subsequent description.

Connected across the high and low d.c. rails is a first voltage divider comprising a pair of resistors 16 and 17 whose common junction 18 is connected to a first output 20 of a differential voltage comparator 21. A second input 22 of the differential voltage comparator 21 is connected to a common junction 23 of a second voltage divider comprising a pair of resistors 24 and 25. A free end 26 of the resistor 25 is connected to a touch plate and constitutes a switch terminal.

An output 27 of the differential voltage comparator 21 is connected to the base of an NPN bipolar junction transistor 28 whose emitter is connected to the low d.c. rail and whose collector is connected to the high d.c. rail 15 via a suitable switching element K which may be an electromagnetic or solid-state relay. An appliance 29 has power connections which are energized via a normally open switch contact 30 which is closed under control of the switching element K in known manner. Thus, the switching element K is analogous to known contactors which allow high voltage devices to be switched via low voltage control or switching circuits.

A person 31 who touches the switch contact 26 whilst standing on ground, GND allows a small electric current to flow through the second pair of resistors 23 and 24 through him to OND. As a result, there is produced an imbalance between the voltages at the two inputs 20 and 22 of the differential voltage comparator 21 whose output 27 thus goes high. When this happens, the bipolar junction transistor conducts thereby energizing the relay K and closing the normally open switch contact 30 thus supplying current to the appliance 29. It will, of course, be appreciated that the same principle can equally well be applied to interrupting the current to the appliance 29 by substituting a normally closed switch contact for the normally open switch contact 30.

Within the context of WO 97/36358, the person 31 causes a ground fault and the switch contact 26 which is electrically floating with respect to GND constitutes a virtual ground connection. These terms will become clearer from the following description of a specific arrangement.

By Ohm's Law, the impedance of an electrical device is equal to the voltage across the device divided by the current flowing therethrough. Thus, if there is no earth leakage to the switch contact 26, then the impedance between the switch contact 26 and the live supply rail 12 is extremely high, assuming that the resistors 23 and 24 have suitably high value resistances. Specifically, if the phase voltage is 220 V and the maximum permitted safe leakage current is 0.9 mA, then the impedance is typically in excess of 250 KΩ. However, in the event of an apparent ground fault, such that the leakage current to the switch contact 26 rises, the impedance drops accordingly. The impedance between the high d.c. rail and the junction 23 thus serves as a measure of whether there is an earth leakage to the switch contact 26.

Since the switch contact 26 is floating relative to GND, the integrity or lack of integrity of the ground connection to the neutral feeder 13 of the electrical supply 11 is no longer significant. Specifically, the provision of a sound ground connection GND or the lack of such provision is not relevant; in either case fast operation of the relay K is ensured within no more than several milli-seconds. It will also be appreciated that by using suitably high value components for the resistors 16, 17, 23 and 24, an apparent ground fault may be produced even when the "ground" leakage current is negligible: for example in the order of nanoamperes. This order of sensitivity is hardly applicable when the detector circuit is used as a regular ground fault protection device as taught in WO 97/36358. However, it is admirably suitable to the application of a high sensitivity touch switch, and the resulting negligible current flow allows high gauge control cables having very small cross-sectional areas to be employed thus reducing the cost of such cables as well as their bulk.

Figure 2:
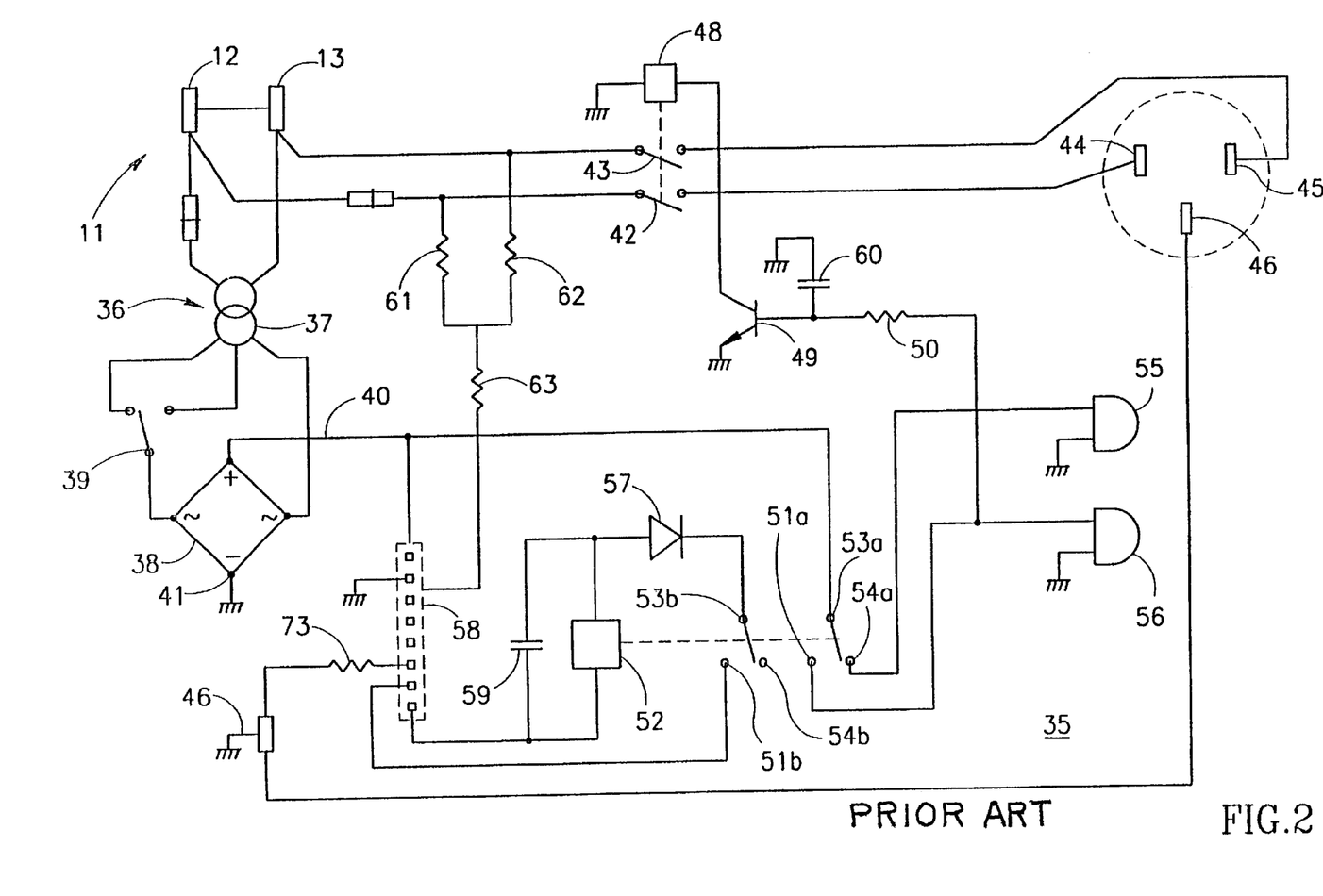
FIG. 2 is a schematic representation of a switching circuit connected to an incoming electrical supply for remote switching of an electrical appliance.

Referring now to FIG. 2, there is shown a circuit diagram of a touch switch 35 based on the above-described principles. Connected across the live and neutral feeders 12 and 13 of a mains electricity supply 11 is an isolation transformer 36 having a tapped secondary winding 37 for stepping down a primary voltage of 110 or 220 V approximately 10 V across respective taps. A d.c. bridge rectifier 38 is connected to an appropriate one of the tapped secondary windings via a selector switch 39 and produces an output voltage of approximately 12 V d.c. across a high voltage rail 40 and a low voltage rail 41 constituting, respectively, supply and ground rails.

The live and neutral inlets 12 and 13 are also connected via corresponding switches 42 and 43 to live and neutral socket outlets 44 and 45, respectively to which the appliance 29 shown in FIG. 1 is connected As shown, there is also provided a ground socket under 46 to which an outer metallic casing of the appliance 29 may be connected, if required. Such connection is not, however, mandatory since unlike the circuit described in WO 97/36358, the touch switch 35 is not used to safeguard against actual ground faults but rather is used for remote switching of the appliance 29.

The switches 42 and 43 constitute switching devices which are simultaneously operated by a relay coil 48 (constituting a main feeder switching means which may be a contactor) connected between ground and the collector of an NPN bipolar junction transistor 49. An emitter of the NPN bipolar junction transistor 49 is connected to ground and a base thereof is connected via a resistor 50 to a first normally open switch contact 51a of a two-pole changeover switch operated by a relay coil 52. The relay coil 52 constitutes an "actuator" having a first pole 53a and a first normally closed switch contact 54a and having a second pole 53b and corresponding second normally open and closed switch contacts 51b and 54b, respectively.

The first pole 53a of the changeover switch is connected to the positive low voltage d.c. supply rail 40 whilst the first normally closed switch contact 54a is connected to one end of a red indication lamp 55 whose other end is connected to ground. Likewise a green indication lamp 56 is connected between ground and the first normally open switch contact 51a. The second pole 53b of the changeover switch is connected via a rectifier diode 57 to the one end of the relay coil 52, a second end of which is connected to the positive low voltage d.c. supply rail 40 via a detector circuit depicted generally as 58 and described in greater detail below with reference to FIG. 3 of the drawings.

A filter capacitor 59 is connected across the relay coil 52. Likewise, for the sake of completeness, a filter capacitor 60 is shown connected between the base of the bipolar junction transistor 49 and ground. Connected between the live and neutral inlets 12 and 13 is a voltage divider comprising a pair of resistors 61 and 62 whose common junction is coupled via a current limiting resistor 63 to one input of a differential comparator within the detector 58 and whose second input is connected to ground. Thus, the differential comparator compares a fraction of the voltage between the live and neutral inlets 12 and 13 to the voltage on the virtual ground connection 46.

Figure 3:
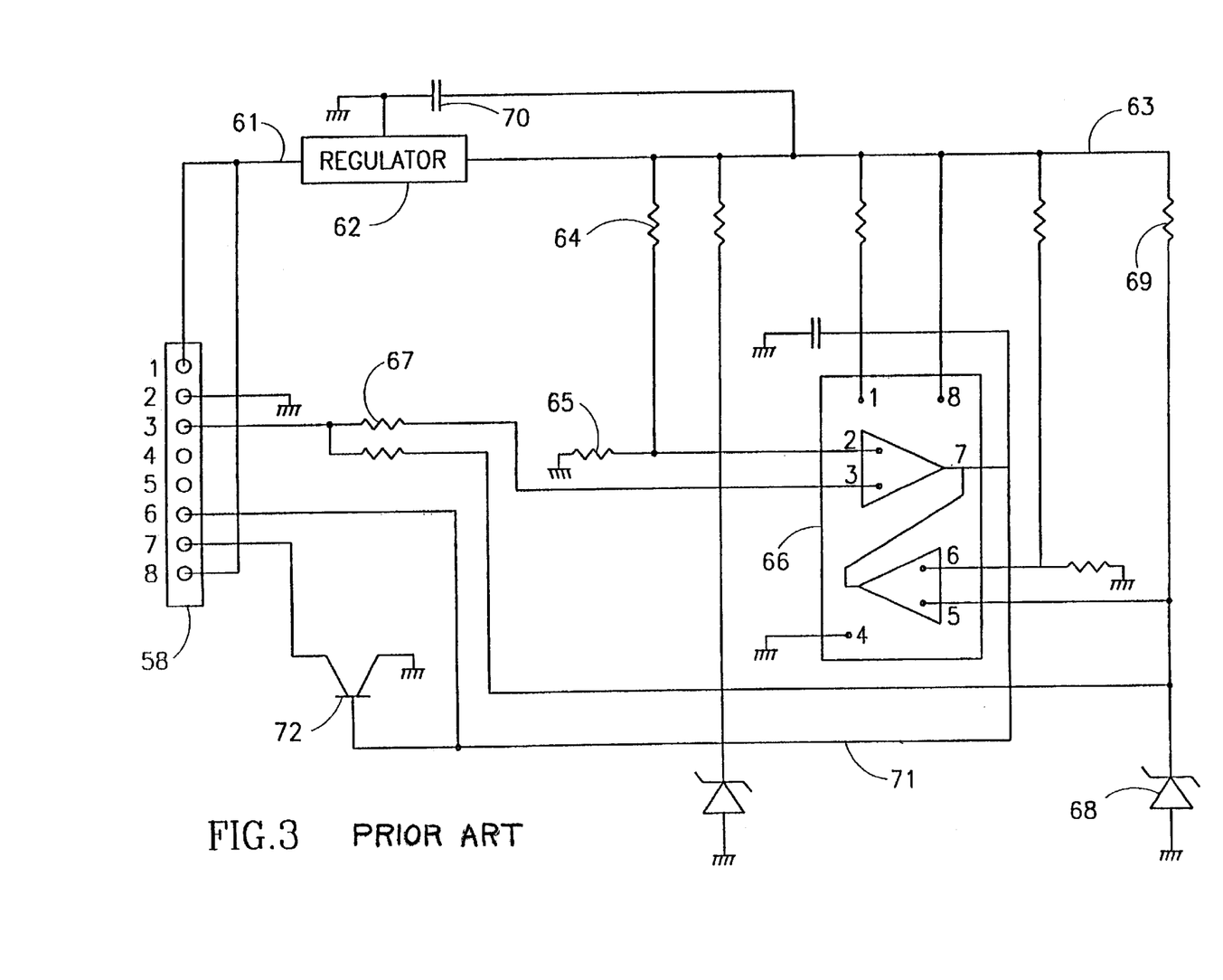
FIG. 3 shows schematically a detail of a differential comparator circuit used within the switching circuit.

Referring to FIG. 3 it is seen that the detector 58 comprises a low voltage d.c. rail 61 connected to the d.c. supply rail 40 shown in FIG. 2. A 6 V regulator 62 is connected between the low d.c. voltage rail 61 and ground such that there exists a regulated 6 V d.c. voltage between a stabilized voltage rail 63 of the regulator 62 and ground.

A first voltage divider comprising resistors 64 and 65 is connected between the stabilized voltage rail 63 and ground and has a common junction connected to a first inverting input (pin 2) of a dual comparator 66 so as to provide a reference voltage signal which is offset from the ground potential by a fixed amount. The common junction of the voltage divider shown in FIG. 2 is also connected via a resistor 67 to the first non-inverting input (pin 3) of the comparator 66. A 6 V Zener diode 68 is connected in series with a current limiting resistor 69 between the stabilized voltage rail 63 and ground, between which is connected a smoothing capacitor 70.

An output 71 (pin 7) of the comparator 66 is connected to the base of an NPN bipolar junction transistor 72 (constituting a "normally open switching circuit") whose emitter is connected to ground and whose collector is connected to the second normally open switch contact 51b shown in FIG. 2. The output 71 is also connected via a resistor 73 (shown in FIG. 2) to ground.

The rectifier diode 57 which is connected across the relay coil 52 shunts any high back e.m.f. generated by the coil 52 and thus avoids damage to the bipolar junction transistor 72.

In order to increase the reliability of the detector 58, the comparator 66 comprises dual comparators sharing a common output and connected in an analogous manner to the arrangement described above. The dual comparator may be constituted by an integrated circuit such as National Semiconductor's LM193 series.

The operation of the detector 58 is as follows. Under normal conditions, there is a large imbalance between the voltage at the virtual ground connection 46 and the fractional feeder voltage which are respectively fed to the input pins of the comparator 66. Consequently, the output voltage of the comparator 66 is high so that the base voltage of the bipolar junction transistor 72 is high and the bipolar junction transistor 72 conducts. In this condition, the bipolar junction transistor 72 functions as short circuit between its emitter and collector such that the normally open switch contact 51b is connected to ground.

The high voltage rail 40 is connected via the resistor 50 to the base of the bipolar junction transistor 49. The bipolar junction transistor 49 thus conducts, allowing current to flow through the relay coil 48 which energizes and closes the switches 42 and 43, thereby connecting the inlet terminals 12 and 13 of the supply 11 to the corresponding socket outlets 44 and 45. At the same time, the high voltage rail 40 is connected to the green indication lamp 56 which thus illuminates and provides a visible indication that the appliance 29 is energized.

If now an operator touches the virtual ground connection 46 constituting the touch plate of the switch contact 26 shown in FIG. 1, an apparent ground fault is produced such that the differential voltage seen by the comparator 66 falls and its output 71 goes low. The transistor 72 is thus cuttoff and its collector is no longer connected to ground. Consequently, the voltage applied to the normally open switch contact 51b (which is closed when the appliance 29 is energized) is no longer at ground potential and so the relay coil 52 de-energizes and the changeover switch contacts revert to the "fault" state shown in FIG. 2. In this state, the high voltage rail 40 is connected to the red indication lamp 55 which illuminates and provides a visual indication that the appliance 29 is now de-energized. At the same time, since the switch contact 51a is no longer connected to the high voltage rail 40, the voltage applied to the base of the bipolar junction transistor 49 goes low and the bipolar junction transistor 49 is cutoff. This de-energizes the relay coil 48 thereby tripping the supply between the inlet terminals 12 and 13 of the adapter 20 and the corresponding outlet terminals 44 and 45 thereof.

There is thus provided in accordance with the invention a highly sensitive touch switch which is responsive to negligible current flow for allowing remote operation and control of an electrical appliance.

Furthermore, since the ground connection of the installation, if present, is in any case isolated from the appliance 29 in that it is quite distinct from the virtual ground connection employed thereby, there is no longer any danger of electric shock if the actual ground of the installation becomes live owing to a breakdown in insulation between the live and ground feeders.

It will also be appreciated that, since the impedance of the appliance is negligible in comparison with the nominal impedance of the virtual ground loop (whose threshold is set to be in the order of 250,000MΩ), the impedance of the virtual ground loop can be measured between the virtual ground connection and either the live or neutral feeders. Assuming a supply voltage of 230 V, such calibration causes a leakage current as low as 0.009 $\mu$A to cause operation of the switch 35.

It will also be appreciated that, whilst in the preferred embodiment the touch switch serves to de-energize the appliance, it can equally well be employed to energize the appliance from an initial de-energized state. This can easily be achieved by reversing the initial states of the switch contacts 53a and 53b or using a contactor having normally closed contacts which open when the bipolar junction transistor 49 becomes saturated. Alternatively, a pair of touch switches can be provided: one for energizing and the other for de-energizing the appliance. Yet a further possibility is to replace one of the bipolar junction transistors 49 or 72 by a bistable multivibrator (flip-flop). Each time the touch switch 35 is touched (thus creating an apparent ground fault), an output of the bistable multivibrator changes stage thus alternatively energizing and de-energizing either one of the relays 48 or 52.

It is also to be understood that use of the virtual ground connection 46 as the ground socket outlet as shown in FIG. 2 is illustrative only. In fact, this is not a desirable implementation for a grounded appliance since no effective ground protection is then afforded. When ground protection is itself an important consideration, the circuit must have much lower sensitivity so as to operate with a leakage current in the order of 0.9 mA. This can best be achieved by using two circuits: one having a virtual ground serving as a ground connection for the appliance and being calibrated for ground fault connection; and the other having very high sensitivity and serving as a touch switch as explained above.

Figure 4:
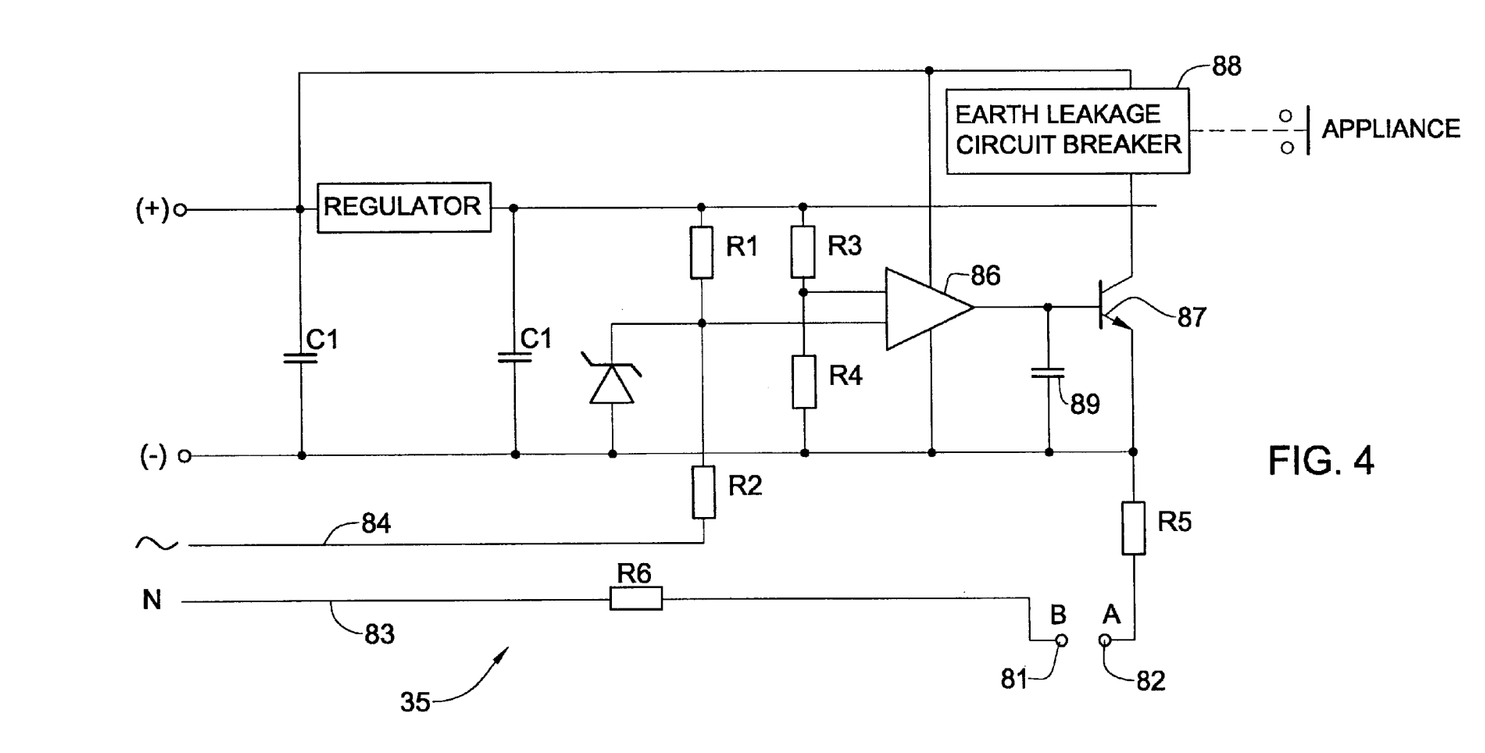
FIG. 4 is a schematic representation of a high-sensitivity switching circuit according to an alternative embodiment of the invention.

Reference is now made to FIG. 4 showing a touch switch depicted generally as 35 comprising normally open first and second switch contacts 81 and 82. The first switch contact 81 is connected to an incoming neutral feeder 83 of an a.c. main supply whose live feeder 84 is connected to an input 85 of a d.c. comparator 86, as described above with reference to FIGS. 1 and 3 of the drawings. Connected to an output of the comparator 86 is the base of an NPN bipolar junction transistor 87 whose emitter is connected to the d.c. zero voltage rail and whose collector is coupled to a relay 88, which may be a contactor for interrupting current to an a.c. appliance. A capacitor 89 is connected at the output of the comparator 86 for smoothing the comparator output voltage which serves as the base bias voltage of the transistor 87.

The touch switch 35 operates as follows. Under normal circumstances, the impedance between the two switch contacts 81 and 82 exceeds the threshold of 500MΩ and the switch is "open circuit". When the impedance across the two switch contacts falls below this value, a small a.c. current in the order of several nanoamperes flows into the input 85 of the comparator 86 causing it to oscillate. That is, the output voltage across the capacitor 89 goes HIGH and LOW The circuit is calibrated so that, when this happens, the net voltage across the capacitor 89 is sufficient to push the transistor 87 into saturation, thereby operating the relay 88.

It should also be noted that, in practice, the first switch contact 81 may be connected to a virtual ground connection as explained above such that finger contact with the second switch contact 82 causes an effective "short" between the two switch contacts, within the context of the invention. That is to say, the impedance between the two switch contacts will fall from several hundred MΩ to less than 1MΩ.

Figure 5:
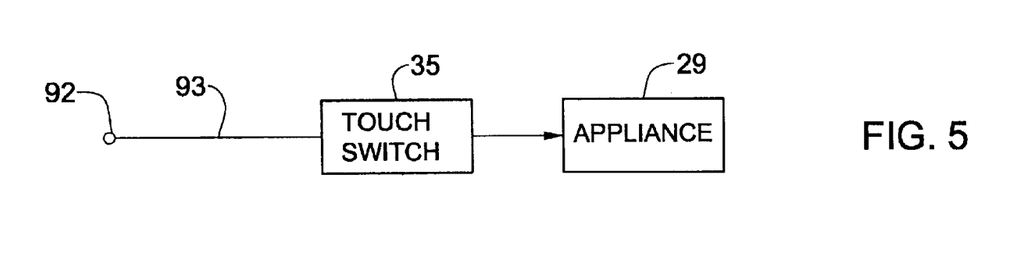
FIG. 5 is a schematic representation of an application using low cost surface wiring for use with the switching circuit according to the invention.

FIG. 5 is a schematic representation of an application using low cost surface wiring for use with the touch switch shown in FIG. 4. Thus there is shown a touch switch 35 for remotely operating an electrical appliance 29 as explained above with reference to FIG. 4 of the drawings. The touch switch 35 is connected to a switch contact 92 via an electrically conductive track 93. Touching the switch current 92 causes a "ground fault" as explained above, thereby operating the touch switch 35 and interrupting current to the electrical appliance 29. The electrically conductive track 93 may be a graphite track and may even be hand drawn using a pencil on the exterior surface of a wall (or any other surface) on which the touch switch 35 is mounted. Alternatively, wallpaper (constituting a surface-covering) may have printed on a surface thereof a conductive track so that by abutting several pieces of wallpaper with the electrical tracks in mutual contact, the effective length of the conductive track can be extended. Preferably, the conductive track is printed on the backside of the wallpaper and the switch contact 92 may be push-fitted though the wallpaper at a desired location so as to effect electrical contact with the hidden track. In similar manner, several switch contacts may be connected to the same track, so as to allow operation of the touch switch 35 from more than one location via a suitably modified wallpaper, carpet or other surface-covering.

The invention also contemplates that the switching circuit is an adapter for coupling the appliance to an electrical socket outlet. Likewise, it may be formed integral with an electrical socket outlet or an electrical plug or with the appliance.

What is claimed is:

1. A switching circuit for use with an electrical appliance operating from an a.c. supply having live and neutral connections and a reliable ground connection, the switching circuit comprising:

a main feeder interruption means operatively coupled to an impedance measuring circuit and being responsive to the switching signal for opening a switching device connected in at least one of the live and neutral connections, first and second normally open switching contacts, and wherein said high sensitivity impedance measuring circuit is coupled to the first and second switch contacts for measuring an impedance therebetween, said high sensitivity impedance measuring circuit including a differential comparator circuit for comparing a fraction of the voltage between the live and neutral connections with a voltage at the first or second switch terminal of the switching circuit and producing at an output thereof a switching signal if a difference between said voltages exceeds a predetermined threshold;

the differential comparator circuit comprising:
   a first input connected to the ground connection of the a.c. supply, and
   a second input connected to a common junction of a voltage divider including a pair of resistors connected in series between the live and neutral terminals of the supply feeder;

the appliance being coupled to said output so as to be responsive to said switching signal; and the first switch contact being electrically floating relative to a ground feeder of the electrical supply, so that a "ground fault" between ground and the first switch contact induces the switching signal.

2. The switching circuit according to claim 1, wherein the electrical appliance operates from an a.c. supply having live and neutral connections and there is further included:

a main feeder interruption means operatively coupled to the impedance measuring circuit and being responsive to the switching signal for opening a switching device connected in at least one of the live and neutral connections.

3. The switching circuit according to claim 2, wherein the main feeder interruption means is a contactor.

4. The switching circuit according to claim 2, wherein the main feeder interruption means is an earth leakage circuit breaker.

5. The switching circuit according to claim 2, wherein the impedance measuring circuit comprises:

a differential comparator circuit for comparing a fraction of the voltage between the live and neutral connections with a voltage at the first or second switch contact of the switching circuit and producing the switching signal if a difference between said voltages exceeds a predetermined threshold.

6. The switching circuit according to claim 1, wherein the main feeder interruption means includes a normally open switching circuit coupled to said switching device connected in at least one of the live and neutral connections and being responsive to the switching signal for closing the switching device.

7. The switching circuit according to claim 6, wherein the differential comparator circuit includes at least two comparators having respective outputs which are commonly connected to said actuator.

8. The switching circuit according to claim 7, further including at least one indication lamp for indicating a state of the actuator.

9. The switching circuit according to claim 8, wherein the main feeder interruption means is connected to a collector of a bipolar junction transistor having a base thereof connected to the normally open indication switch contact so as to be connected to the supply rail of the d.c. supply when the actuator is energized.

10. The switching circuit according to claim 1, wherein the main feeder interruption means includes a normally closed switching control coupled to said switching device connected in at least one of the live and neutral connections and being responsive to the switching signal for opening the switching device.

11. The switching circuit according to claim 1, wherein the main feeder interruption means includes a normally closed switching control coupled to said switching device connected in at least one of the live and neutral terminals and being responsive to the switching signal for opening the switching device.

12. The switching circuit according to claim 1, wherein the main feeder interruption means includes a bistable switching circuit coupled to said switching device which is responsive to the switching signal for alternatively opening and closing the switching device.

13. The switching circuit according to claim 1, wherein the differential comparator circuit is an integrated circuit.

14. The switching circuit according to claim 1, being an adapter for coupling the appliance to an electrical socket outlet.

15. The switching circuit according to claim 1, being integral with an electrical socket outlet.

16. The switching circuit according to claim 1, being integral with an electrical plug.

17. The switching circuit according to claim 1, being integral with the appliance.

18. The switching circuit according claim 1, wherein the predetermined threshold is selectable.

19. The switching circuit according to claim 18, wherein the predetermined threshold is selectable and the impedance measuring circuit comprises:

a differential comparator circuit connected as an open loop amplifier being calibrated to operate at its stability threshold so that injection of an a.c. current to an input thereof pushes the amplifier into saturation thereby producing the switching signal.

20. A control system for switching an electrical appliance operating from an a.c. supply having live and neutral connections, said control system comprising:

a switching circuit including:
   first and second normally open switch contacts, and
   a high sensitivity impedance measuring circuit coupled to the first and second switch contacts for measuring an impedance therebetween, said high sensitivity impedance measuring circuit producing at an output thereof a switching signal if said impedance is lower than a predetermined threshold;
   the first switch contact being electrically floating relative to a ground feeder of an electrical supply, so that a "ground fault" between ground and the first switch contact induces the switching signal,
   said switching circuit being operatively coupled to the electrical appliance for supplying or interrupting electrical power thereto, and
   an auxiliary switch contact being connected by an electrical conductor to the second switch contact of the switching circuit so that an impedance between the auxiliary switch contact and the first switch contact less than a predetermined threshold produces the switching signal;
   the second switch contact being mounted on a surface of a room and the electrical conductor being associated with a surface-covering for applying to said surface, so as to allow extended operation of the switching circuit within the room remote from the second switch contact.

21. The control system according to claim 20, wherein the electrical conductor is formed by marking with an electrically conductive material on said surface.

22. A switching circuit for use with an electrical appliance operating from an a.c. supply having live and neutral connections and an unreliable ground connection, the switching circuit comprising:

a main feeder interruption means operatively coupled to the impedance measuring circuit and being responsive to the switching signal for opening a switching device connected in at least one of the live and neutral connections, first and second normally open switch contacts, and a high sensitivity impedance measuring circuit coupled to the first and second switch contacts for measuring an impedance therebetween, said high sensitivity impedance measuring circuit including a differential comparator circuit for comparing a fraction of the voltage between the live and neutral connections with a voltage at the first or second switch terminal of the switching circuit and producing at an output thereof a switching signal if a difference between said voltages exceeds a predetermined threshold; said impedance is lower than a predetermined threshold;

the differential comparator circuit comprising:

a first input connected to a virtual ground connection which is electrically floating relative to the ground connection of the a.c. supply, and a second input connected to a common junction of a voltage divider including a pair of resistors connected in series between the live and neutral terminals of the supply feeder, the appliance being coupled to said output so as to be responsive to said switching signal; and the first switch contact being electrically floating relative to a ground feeder of an the electrical supply, so that a "ground fault" between ground and the first switch contact induces the switching signal.

23. The switching circuit according to claim 22, wherein the first switch terminal is electrically floating relative to a ground feeder of an electrical supply, so that a "ground fault" between ground and the first switch terminal induces the switching signal.

24. The switching circuit according to claim 22, wherein the main feeder interruption means is a contactor.

25. The switching circuit according to claim 22, wherein the main feeder interruption means is an earth leakage circuit breaker.

26. The switching circuit according to claim 22, further comprising:

an actuator operatively coupled to an output of the differential comparator and connected in series with the main feeder interruption means.

27. The switching circuit according to claim 26, wherein the differential comparator circuit includes at least two comparators having respective outputs which are commonly connected to said actuator.

28. The switching circuit according to claim 27, further including at least one indication lamp for indicating a state of the actuator.

29. The switching circuit according to claim 28, wherein the main feeder interruption means is connected to a collector of a bipolar junction transistor having a base thereof connected to the normally open indication switch contact so as to be connected to the supply rail of the d.c supply when the actuator is energized.

30. The switching circuit according to claim 22, wherein the main feeder interruption means includes a normally open switching circuit coupled to said switching device connected in at least one of the live and neutral terminals and being responsive to the switching signal for closing the switching device.

31. The switching circuit according to claim 22, wherein the main feeder interruption means includes a normally closed switching circuit coupled to said switching device connected in at least one of the live and neutral terminals and being responsive to the switching signal for opening the switching device.

32. The switching circuit according to claim 22, wherein the main feeder interruption means includes a bistable switching circuit coupled to said switching device which is responsive to the switching signal for alternatively opening and closing the switching device.

33. The switching circuit according to claim 22, wherein the differential comparator circuit is an integrated circuit.

34. The switching circuit according to claim 22, being an adapter for coupling the appliance to an electrical socket outlet.

35. The switching circuit according to claim 22, being integral with an electrical socket outlet.

36. The switching circuit according to claim 22, being integral with an electrical plug.

37. The switching circuit according to claim 22, being integral with the appliance.

38. The switching circuit according to claim 22, wherein the predetermined threshold is selectable.

39. The switching circuit according to claim 22, wherein the predetermined threshold is selectable and the impedance measuring circuit comprises:

a differential comparator circuit connected as an open loop amplifier being calibrated to operate at its stability threshold so that injection of an a.c. current to an input thereof pushes the amplifier into saturation thereby producing the switching signal.

* * * * *